US006936548B2

United States Patent
Dussarrat et al.

(10) Patent No.: US 6,936,548 B2
(45) Date of Patent: Aug. 30, 2005

(54) METHOD FOR DEPOSITING SILICON NITRIDE FILMS AND SILICON OXYNITRIDE FILMS BY CHEMICAL VAPOR DEPOSITION

(75) Inventors: Christian Dussarrat, Ibaraki (JP); Jean-Marc Girard, Paris (FR)

(73) Assignee: L'Air Liquide, Societe Anonyme pour l'etude et, l'Exploitation des Procedes Georges Claude, Paris (FR)

(*) Notice: Subject to any disclaimer, the term of this patent is extended or adjusted under 35 U.S.C. 154(b) by 0 days.

(21) Appl. No.: 10/497,455

(22) PCT Filed: Nov. 27, 2002

(86) PCT No.: PCT/EP02/13869

§ 371 (c)(1),
(2), (4) Date: Oct. 12, 2004

(87) PCT Pub. No.: WO03/046253

PCT Pub. Date: Jun. 5, 2003

(65) Prior Publication Data

US 2005/0037627 A1 Feb. 17, 2005

(30) Foreign Application Priority Data

Nov. 30, 2001 (JP) .................................. 2001-367126

(51) Int. Cl.$^7$ .............................................. H01L 21/31
(52) U.S. Cl. ...................................................... 438/769
(58) Field of Search ................................ 438/791, 786, 438/778, 769

(56) References Cited

U.S. PATENT DOCUMENTS 5,874,368 A 2/1999 Laxman et al.
5,976,991 A 11/1999 Laxman et al.

FOREIGN PATENT DOCUMENTS

| EP | 0 935 284 A | 8/1999 |
| JP | 62 050466 A | 7/1987 |
| JP | 02 138471 A | 5/1990 |
| JP | 08 022986 A | 1/1996 |

OTHER PUBLICATIONS

International Search Report for PCT/EP02/13869.

Primary Examiner—Craig A. Thompson
Assistant Examiner—Monica D. Harrison
(74) Attorney, Agent, or Firm—Linda K. Russell (57) ABSTRACT

A method for producing silicon nitride and silicon oxynitride films by CVD technology, where even at lower temperatures, acceptable film-deposition rates are achieved, without the by-product production of large amounts of ammonium chloride.

32 Claims, 3 Drawing Sheets

METHOD FOR DEPOSITING SILICON NITRIDE FILMS AND SILICON OXYNITRIDE FILMS BY CHEMICAL VAPOR DEPOSITION

BACKGROUND OF THE INVENTION

This invention relates to methods for producing silicon nitride films and silicon oxynitride films by chemical vapor deposition (CVD).

Silicon nitride films exhibit excellent barrier properties and an excellent oxidation resistance and for these reasons are used for, for example, etch-stop layers, barrier layers, gate insulation layers, and ONO stacks in the fabrication of microelectronic devices.

The main technologies in use at the present time for the formation of silicon nitride films are plasma-enhanced CVD (PECVD) and low-pressure CVD (LPCVD).

In PECVD, a silicon source (typically a silane) and a nitrogen source (typically ammonia but more recently nitrogen) are introduced between a pair of parallel-plate electrodes and high-frequency energy is applied between the two electrodes at low temperatures (about 300° C.) and intermediate pressures (0.1 to 5 Torr) in order to generate a plasma from the silicon source and nitrogen source. Active silicon species and active nitrogen species in the generated plasma react with each other to produce a silicon nitride film. The silicon nitride films produced by PECVD generally do not have a stoichiometric composition and are also hydrogen rich. As a result, these silicon nitride films have a low film density and a high etch rate and are of poor quality.

LPCVD, which does not employ a plasma, is used in order to deposit high-quality silicon nitride films. LPCVD as it is currently practiced uses low pressures (0.1 to 2 Torr) and high temperatures (750–900° C.) and produces silicon nitride films of a quality superior to that of the silicon nitride films produced by PECVD. Silicon nitride films have generally been produced by this LPCVD technology by the reaction of dichlorosilane (DCS) and ammonia gas. However, the existing LPCVD technology requires fairly high temperatures in order to obtain acceptable deposition (film formation) rates ($\geq 10$ Å/minute) for silicon nitride films. For example, temperatures of 750 to 800° C. are typically used for the reaction of DCS and ammonia In addition, the reaction of DCS and ammonia produces large amounts of ammonium chloride, which can accumulate in and clog the exhaust plumbing system of the CVD reaction apparatus.

A number of silicon nitride precursors have been introduced for the purpose of obtaining satisfactory silicon nitride film deposition rates at low temperatures. Hexachlorodisilane (HCDS) is one example of such precursors. HCDS produces $SiCl_2$ at relatively low temperatures by the reaction $Si_2Cl_6 \rightarrow SiCl_2 + SiCl_4$ and this $SiCl_2$ reacts well with ammonia The use of HCDS can provide silicon nitride film deposition at film formation rates of approximately 10 Å/minute at 600° C.

Another example of these precursors is the is(tert-butylamino)silane (BTBAS) described in U.S. Pat. No. 5,874,368. Use of BTBAS can also provide silicon nitride film deposition at lower temperatures than for the use of DCS. As in the case of HCDS, BTBAS enables the deposition of silicon nitride films at a film formation rate of approximately 10 Å/minute at 600° C.

While both HCDS and BTBAS can achieve film formation rates of approximately 10 Å/minute at 600° C., this performance level also means that commercially acceptable film formation rates will not be obtained at lower temperatures $\leq 550°$ C., or in specific terms that a film formation rate of at least 10 Å/minute will not be obtained at lower temperatures $\leq 550°$ C. These two precursors are also associated with the disadvantages described below.

HCDS, being a completely chlorinated disilane, has a high chlorine content, and the Si—Cl bond is also very strong. As a consequence, the chlorine content in the resulting silicon nitride film will increase as the reaction temperature declines, and it has been found that the chlorine content reaches as high as about 2 atom % at a 600° C. reaction temperature. In addition, HCDS also leads to the production of large amounts of ammonium chloride just as in the case of DCS.

BTBAS has an activation energy of 56 kcal/mole, with the result that its silicon nitride film formation rate declines drastically when the reaction temperature is reduced. It is estimated that its film formation rate drops to a quite small 3 Å/minute at a reaction temperature of 550° C.

The same problems appear when the aforementioned prior art precursors are used to produce silicon oxynitride films, which have the same physical properties and applications as silicon nitride films.

The issue addressed by this invention, therefore, is to provide a method for the production of silicon nitride and silicon oxynitride films by CVD technology, wherein said method provides acceptable film formation rates even at lower temperatures and is not accompanied by the production of large amounts of ammonium chloride.

SUMMARY

The first aspect of this invention provides a method for producing silicon nitride films by chemical vapor deposition, said method being characterized by introducing a hydrocarbylaminodisilane compound with the general formula $(R^0)_3$—Si—Si—$(R^0)_3$     (I)

wherein
each $R^0$ is independently selected from the hydrogen atom, chlorine atom, and —$NR^1(R^2)$ groups (wherein $R^1$ and $R^2$ are each independently selected from the hydrogen atom and $C_1$ to $C_4$ hydrocarbyl with the proviso that $R^1$ and $R^1$ may not both be the hydrogen atom) and at least one $R^0$ is the —$NR^1(R^2)$ group and a nitrogen-containing gas selected from the group consisting of ammonia, hydrazine, alkylhydrazine compounds, and hydrogen azide into a reaction chamber loaded with at least 1 substrate and forming a silicon nitride film on the substrate by reacting the hydrocarbylaminodisilane compound and nitrogen-containing gas at a reaction temperature.

The second aspect of this invention provides a method for producing silicon oxynitride films by chemical vapor deposition, characterized by introducing a hydrocarbylaminodisilane compound with formula (I), a nitrogen-containing gas selected from the group consisting of ammonia, hydrazine, and hydrogen azide, and an oxygen-containing gas selected from the group consisting of NO, $N_2O$, $NO_2$, $O_2$, $O_3$, $H_2O$, and $H_2O_2$ into a reaction chamber loaded with at least 1 substrate and forming a silicon oxynitride film on the substrate by reacting the hydrocarbylaminodisilane compound, nitrogen-containing gas, and oxygen-containing gas at a reaction temperature.

BRIEF DESCRIPTION OF THE DRAWINGS

For a further understanding of the nature and objects for the present invention, reference should be made to the following detailed description, taken in conjunction with the accompanying drawings, in which like elements are given the same or analogous reference numbers and wherein.

DESCRIPTION OF PREFERRED EMBODIMENTS

This invention will be explained in greater detail in the following.

This invention uses special compounds as precursors for silicon nitride and silicon oxynitride (collectively referred to below as silicon (oxy)nitride) in the formation of silicon nitride films and silicon oxynitride films (collectively referred to below as silicon (oxy)nitride films) on substrates by thermal CVD technology.

The silicon (oxy)nitride precursors used in this invention are hydrocarbylaminodisilane compounds with formula (I).

$(R^0)_3$—Si—Si—$(R^0)_3$  (I)

Each $R^0$ in (I) is independently selected from the hydrogen atom, chlorine atom, and the —$NR^1(R^2)$ group and at least one group $R^0$ must be the —$NR^1(R^2)$ group. $R^1$ and $R^2$ in the —$NR^1(R^2)$ group are each independently selected from the hydrogen atom and $C_1$ to $C_4$ hydrocarbyl with the proviso that $R^1$ and $R^2$ may not both be the hydrogen atom. The $C_1$ to $C_4$ hydrocarbyl includes vinyl and $C_1$ to $C_4$ alkyl such as methyl, ethyl, propyl, isopropyl, butyl, and tert-butyl.

Compounds in which each $R^0$ is —$NR^1(R^2)$, $R^1$ is the hydrogen atom, and $R^2$ is $C_1$ to $C_4$ hydrocarbyl, that is, hexakis(monohydrocarbylamino)disilanes with formula (II)

$((R)HN)_3$—Si—Si—$(NH(R))_3$  (II)

(each R independently represents $C_1$ to $C_4$ hydrocarbyl) are novel compounds and are preferred compounds within the scope of this invention.

Hexakis(monohydrocarbylamino)disilanes with formula (II) can be synthesized by reacting hexachlorodisilane ($Cl_3$—Si—Si—$Cl_3$) in organic solvent with at least 6-fold moles of the monohydrocarbylamine $RNH_2$ (R=$C_1$ to $C_4$ hydrocarbyl). The monohydrocarbylamine for reaction with hexachlorodisilane includes, inter alia, methylamine, ethylamine, propylamine, isopropylamine, tert-butylamine, and vinylamine. The monohydrocarbylamine used can take the form of a single monohydrocarbylamine or a mixture of monohydrocarbylamines. However, the use of a single monohydrocarbylamine is preferred viewed from the perspective of ease of production, and the use of ethylamine is even more preferred.

As specified above, the hexachlorodisilane and monohydrocarbylamine are reacted with each other using at least 6 moles of the latter per 1 mole of the former. However, the use of a large excess of the monohydrocarbylamine over hexachlorodisilane is preferred for the purpose of inhibiting the production of N-hydrocarbyldisilazane. In specific terms, the use of a hexachlorodisilane:monohydrocarbylamine molar ratio of 1:12 to 1:36 is preferred. Use of at least 12 moles monohydrocarbylamine per 1 mole hexachlorodisilane also enables trapping, as the monohydrocarbylamine hydrochloride (solid), of the hydrogen chloride (6 moles) that is produced as a by-product in the reaction. This monohydrocarbylamine hydrochloride can be easily removed from the reaction mixture post-reaction by filtration.

Organic solvent is used as the reaction solvent for reaction of the hexachlorodisilane and monohydrocarbylamine. This organic solvent encompasses tetrahydrofuran and straight-chain and cyclic hydrocarbons, for example, pentane, hexane, and octane. Pentane is the preferred solvent.

The reaction between hexachlorodisilane and monohydrocarbylamine is preferably run at a temperature from –30° C. to +50° C. In general, this reaction will be run by first bringing the reaction solvent to a temperature in the preferred range of –30° C. to +50° C., introducing the monohydrocarbylamine into the reaction solvent and dissolving it therein, and then gradually adding the hexachlorodisilane, for example, by dropwise addition. The hexachlorodisilane can be dropped in either neat or dissolved in the same solvent as the reaction solvent. The reaction is subsequently ran for 2 to 24 hours while stirring the reaction solvent and holding at the aforementioned temperature. After this period of stirring, the reaction solvent is heated to room temperature (approximately 20° C. to 50° C.) and stirring is preferably continued for at least another 10 hours. The hydrocarbylammonium chloride, a solid by-product, is then filtered off and the solvent and residual amine are distilled off in vacuo. The resulting hexakis(monohydrocarbylamino) disilane can be subjected to additional purification by fractional distillation.

The hexakis(monohydrocarbylamino)disilanes (II) are liquids at ambient temperatures (approximately 20° C. to 50° C.), do not contain chlorine, and are highly reactive and in particular support excellent silicon (oxy)nitride film formation rates at low temperatures ($\leq 600°$ C.). Their high reactivity is caused by the bonding of the monohydrocarbylamino group to the silicon and by the weak Si—Si direct bond. Hexakis(monoethylamino)disilane is a particularly preferred hexakis(monohydrocarbylamino)disilane (II).

In order to form silicon nitride using the inventive hydrocarbylaminodisilane compounds (I), the hydrocarbylaminodisilane compound (I) and nitrogen-containing gas are admitted into a reaction chamber loaded with at least 1 substrate (typically a semiconductor substrate such as a silicon substrate) and silicon nitride is deposited on the semiconductor substrate by reacting the hydrocarbylaminodisilane compound and nitrogen-containing gas at the reaction temperature. The nitrogen-containing gas can be selected from the group consisting of ammonia, hydrazine, alkylhydrazine compounds, and hydrogen azide.

The molar ratio between the hydrocarbylaminodisilane compound and nitrogen-containing gas admitted into the reaction chamber during silicon nitride production is preferably 1:0 to 1:50. The total pressure within the reaction chamber is preferably maintained at from 0.1 to 10 Torr. The reaction temperature is preferably from –300° C. to 650° C.

In order to form silicon oxynitride using the inventive hydrocarbylaminodisilane compounds (I), the hydrocarbylaminodisilane compound (I), nitrogen-containing gas, and oxygen-containing gas are admitted into a reaction chamber loaded with at least one substrate (typically a semiconductor substrate such as a silicon substrate) and a silicon oxynitride film is deposited on the substrate by reacting the hydrocarbylaminodisilane compound, nitrogen-containing gas, and oxygen-containing gas at the reaction temperature. As with silicon nitride film deposition, the nitrogen-containing gas can be selected from the group consisting of ammonia, hydrazine, and hydrogen azide. The oxygen-containing gas can be selected from the group consisting of NO, $N_2O$, $NO_2$, $O_2$, $O_3$, $H_2O$, and $H_2O_2$.

When the oxygen-containing gas also contains nitrogen (NO, $N_2O$, and/or $NO_2$), the nitrogen-containing gas need not be used and the ratio between the hydrocarbylaminodisilane compound and the nitrogen-containing gas admitted into the reaction chamber during silicon oxynitride production is preferably 1:0 to 1:50. When the oxygen-containing gas does not contain nitrogen ($O_2$, $O_3$, $H_2O$, and/or $H_2O_2$), the molar ratio between the hydrocarbylaminodisilane compound and the nitrogen-containing gas is preferably 10:1 to 1:50. In either case the molar ratio between the hydrocarbylaminodisilane compound and oxygen-containing gas is preferably 50:1 to 1:10. The overall pressure within the reaction chamber is preferably maintained in the range from 0.1 to 10 Torr, and the reaction temperature is preferably –300° C. to 750° C.

The hydrocarbylaminodisilane compound (I) can be vaporized using a bubbler or a vaporizer during silicon (oxy)nitride production according to this invention. The bubbler can comprise a sealed container filled with liquid hydrocarbylaminodisilane compound (I), an injection conduit that injects carrier gas into the hydrocarbylaminodisilane compound in the sealed container, and a feed conduit that removes hydrocarbylaminodisilane compound— vaporized and entrained into the carrier gas injected from the injection conduit into the hydrocarbylaminodisilane compound—from the sealed container and feeds this vaporized hydrocarbylaminodisilane compound into the reaction chamber. At its downstream end this feed conduit communicates with the CVD reaction chamber. The temperature and pressure within the sealed container must be maintained at constant or specified values.

A Direct Liquid Injection System (DLI-25) from the MKS Company or a VU-410A vaporizer from the Lintec Company, for example, can be used as the vaporizer. The hydrocarbylaminodisilane compound is vaporized using the vaporizer and fed to the reaction chamber.

Figure 1:
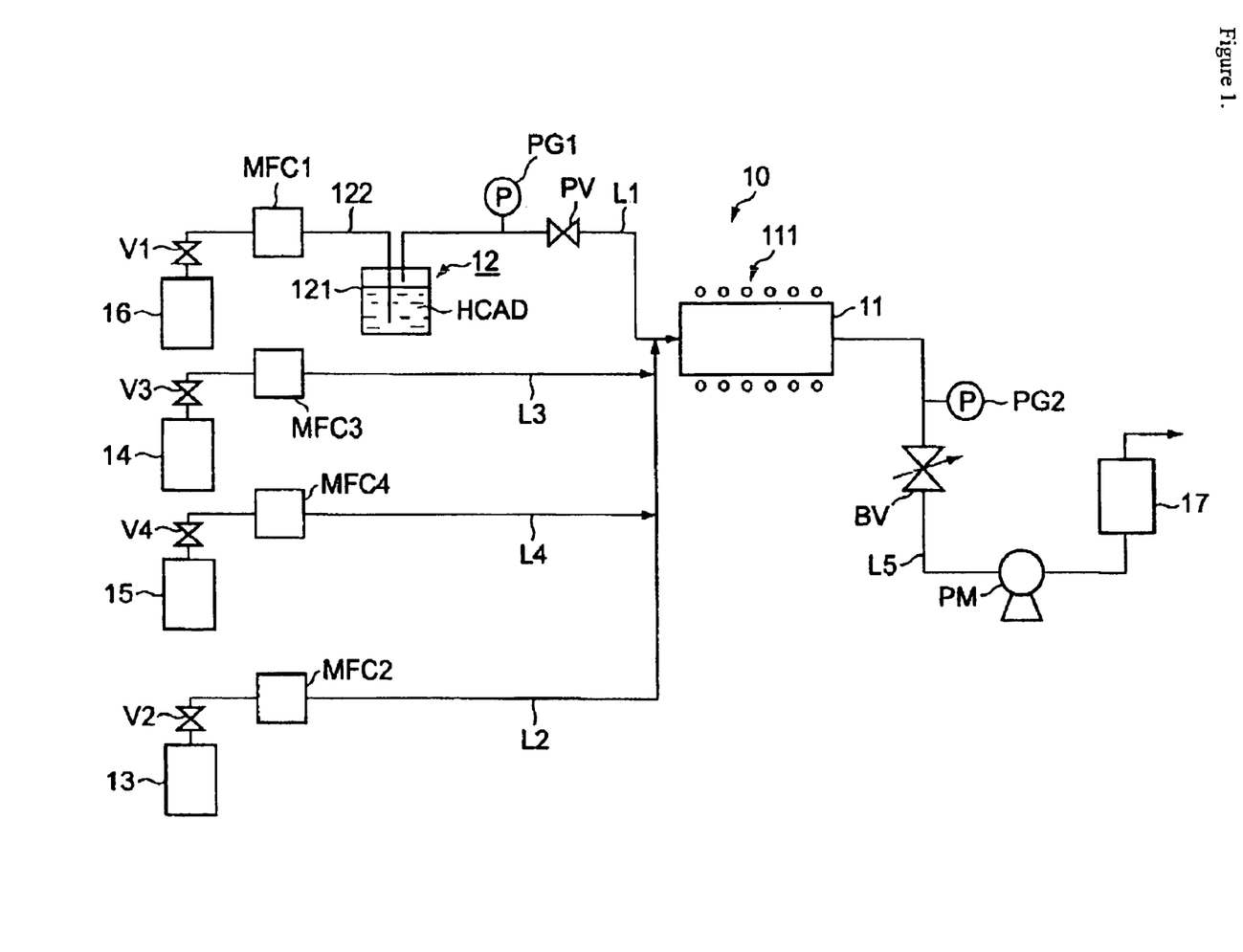
FIG. 1 illustrates one embodiment of a CVD reaction apparatus that may be used to create silicon oxynitride films as taught by the invention.

FIG. 1 contains a block diagram that illustrates one example of a CVD reaction apparatus well suited for execution of the inventive method for producing silicon (oxy) nitride films.

The CVD reaction apparatus 10 illustrated in FIG. 1 is provided with a CVD reaction chamber 11, a supply source 12 for the hydrocarbylaminodisilane compound (HCAD) according to this invention, a nitrogen-containing gas supply source 13, and a supply source 14 of dilution gas, such as an inert gas, that is introduced as necessary. The CVD reaction apparatus 10 is also provided with an oxygen-containing gas supply source 15 when silicon oxynitride is to be produced The reaction chamber 11 is surrounded by a heating means 111 for the purpose of heating to the specified CVD reaction temperature (batch processing). A susceptor is heated in the case of single wafer processing.

In the case of the CVD reaction apparatus 10 illustrated in FIG. 1, the HCAD is introduced into the reaction chamber 11 in the gas phase due to the action of a bubbler. The HCAD supply source 12 is provided with a sealed container 121 that is loaded with liquid HCAD. An injection conduit 122 is inserted into the sealed container 121 in order to inject carrier gas into the HCAD loaded in the sealed container 121; the carrier gas is injected from the supply source 16 for the carrier gas, e.g., nitrogen, across the valve V1 and mass flow controller MFC1. After its injection into the HCAD, the HCAD-entraining carrier gas passes through the pressure-control valve PV and into the line L1 and is introduced into the reaction chamber 11. A pressure sensor PG1 is connected to the line L1 Although not shown in the figure, at least 1 substrate (typically a semiconductor substrate such as a silicon substrate) is loaded in the reaction chamber 11. From 1 to 250 substrates (chuck- or wafer boat-loaded) can be present Nitrogen-containing gas, e.g., ammonia, is introduced from the nitrogen-containing gas supply source 13 across the valve V2 and the mass flow controller MFC2 and into the reaction chamber 11 through the line L2.

Dilution gas, which is introduced as necessary, can be introduced from the dilution gas supply source 14 across the valve V3 and the mass flow controller MFC3 and into the reaction chamber 11 through the line L3 and the line L2.

Oxygen-containing gas, which is introduced during production of silicon oxynitride films, can be introduced from the oxygen-containing gas supply source 15 across the valve V4 and the mass flow controller MFC4 and into the reaction chamber 11 through the line L4 and the line L2.

The outlet from the reaction chamber 11 is connected by the line L5 to a waste gas treatment apparatus 17. This waste gas treatment apparatus 17 functions to remove, for example, by-products and unreacted material, and to -exhaust the gas after abatement from the system. A pressure sensor PG2, a butterfly valve BV, and a pump PM are connected in the line L5. The various gases are introduced into the reaction chamber 11, the pressure within the reaction chamber 11 is monitored by the pressure sensor PG2, and the pressure is brought to its prescribed value by the opening and closing of the butterfly valve BV by the operation of the pump PM.

During operation, the container 121 is heated to, for example, 50° C. to 80° C., and the HCAD feed system, which comprises the line L1, is preferably heated to a temperature higher than the bubbler in order to prevent dew formation by the HCAD.

Figure 2:
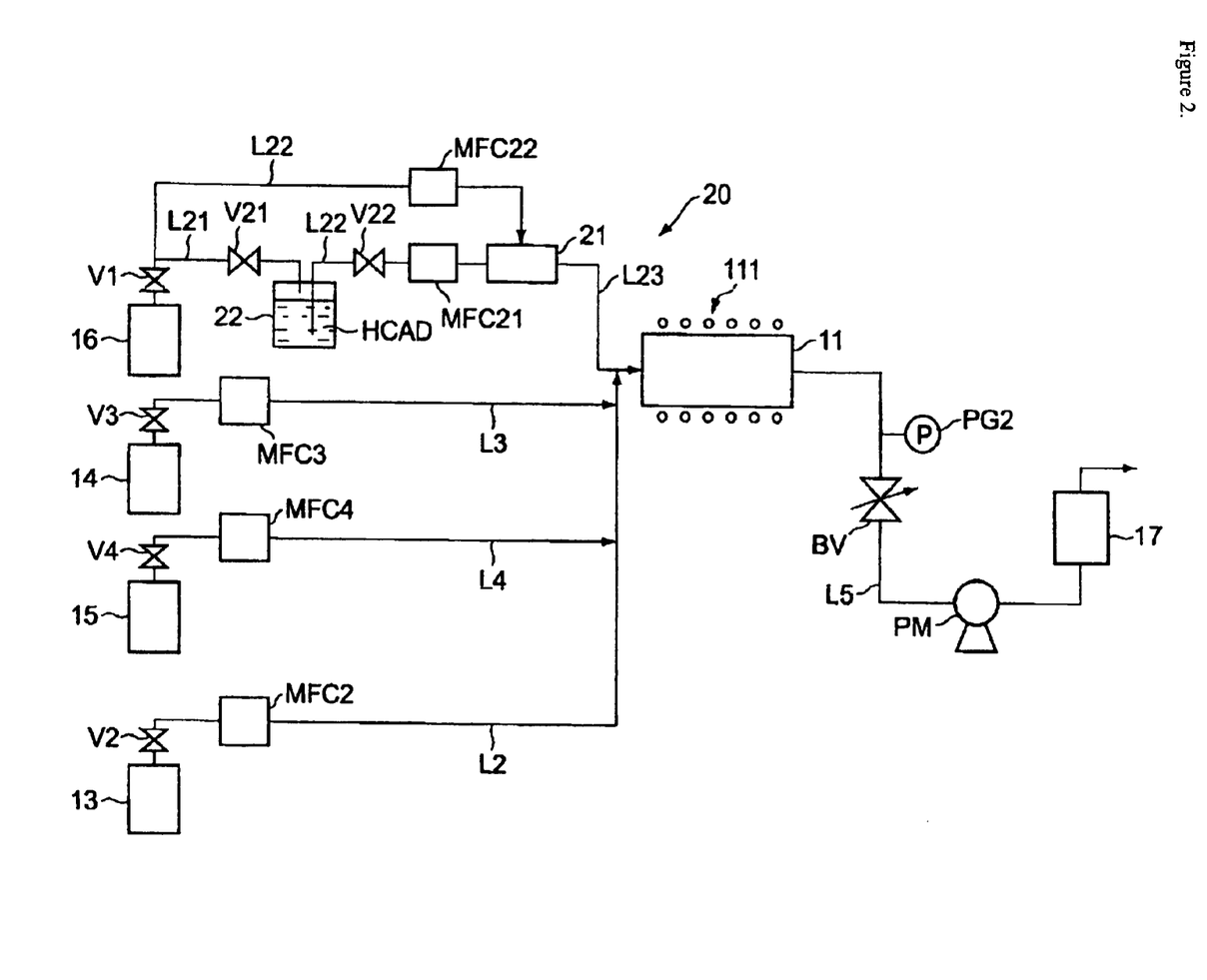
FIG. 2 illustrates another embodiment of a CVD reaction apparatus that may be used to create silicon nitride films as taught by the invention.

FIG. 2 contains a CVD reaction apparatus that has the same structure as the CVD reaction apparatus 10 illustrated in FIG. 1, with the exception that the CVD reaction apparatus in FIG. 2 contains a different HCAD feed system. Those elements that are the same in both figures have been assigned the same reference symbol and will not be considered again in detail.

The CVD reaction apparatus 20 illustrated in FIG. 2 is provided with a vaporizer 21. Carrier gas from the carrier gas source 16 passes across the valve V1 and through the line L21 and is introduced into the gas-phase region for the HCAD filled in liquid form in the sealed container 22. The pressure exerted by the carrier gas functions to move the liquid HCAD across the valve V22 and the mass flow controller MFC21, through the line L22, and into the vaporizer 21. Carrier gas from the carrier gas source 16 also passes through the line L22, which branches from the line L21, and is introduced into the vaporizer 21. The carrier gas and liquid HCAD introduced into the vaporizer 21 are heated in the vaporizer 21 to, for example, 60° C. to 200° C., and the HCAD is vaporized and is transported with the carrier gas through the line L23 and is introduced into the reaction chamber 11. The line L23 is preferably heated to 50° C. to –250° C. in order to prevent reliquefaction or dew formation by the HEAD.

EXAMPLES

This invention is described in greater detail in the following through working examples, but the invention is not limited to these examples.

Synthesis Example 1

Synthesis of Hexakis(monoethylamino)disilane (HEAD)

Pentane was used as the reaction solvent and was cooled to 0° C. for the reaction. An ethylamine solution was prepared by adding ethylamine (70 g, 1.55 mol) cooled to 0° C. to the cold pentane. Hexachlorodisilane (26.9 g, 0.1 mol) was gradually added to this ethylamine solution. The resulting reaction solution was thereafter stirred for 2 hours at 0° C. and then for an additional 15 hours at room temperature (20° C.). The ethylamonium-chloride by-product was filtered off and the pentane and ethylamine were distilled out in vacuo. 22.4 g HEAD was obtained (yield=70%).

Results of Analysis $^1$H-NMR ($C_6D_6$, 500 MHz): δ=0.61 ppm (broad, —NH), δ=1.1 ppm (triplet, —$CH_3$), δ(pentet, —$CH_2$)

$^{13}$C-NMR ($C_6D_6$, 125 MHz): 20.7 ppm and 36.1 ppm (—$CH_2CH_3$)

A signal assignable to the SiH bond was not observed in these NMR analyses.

Figure 3:
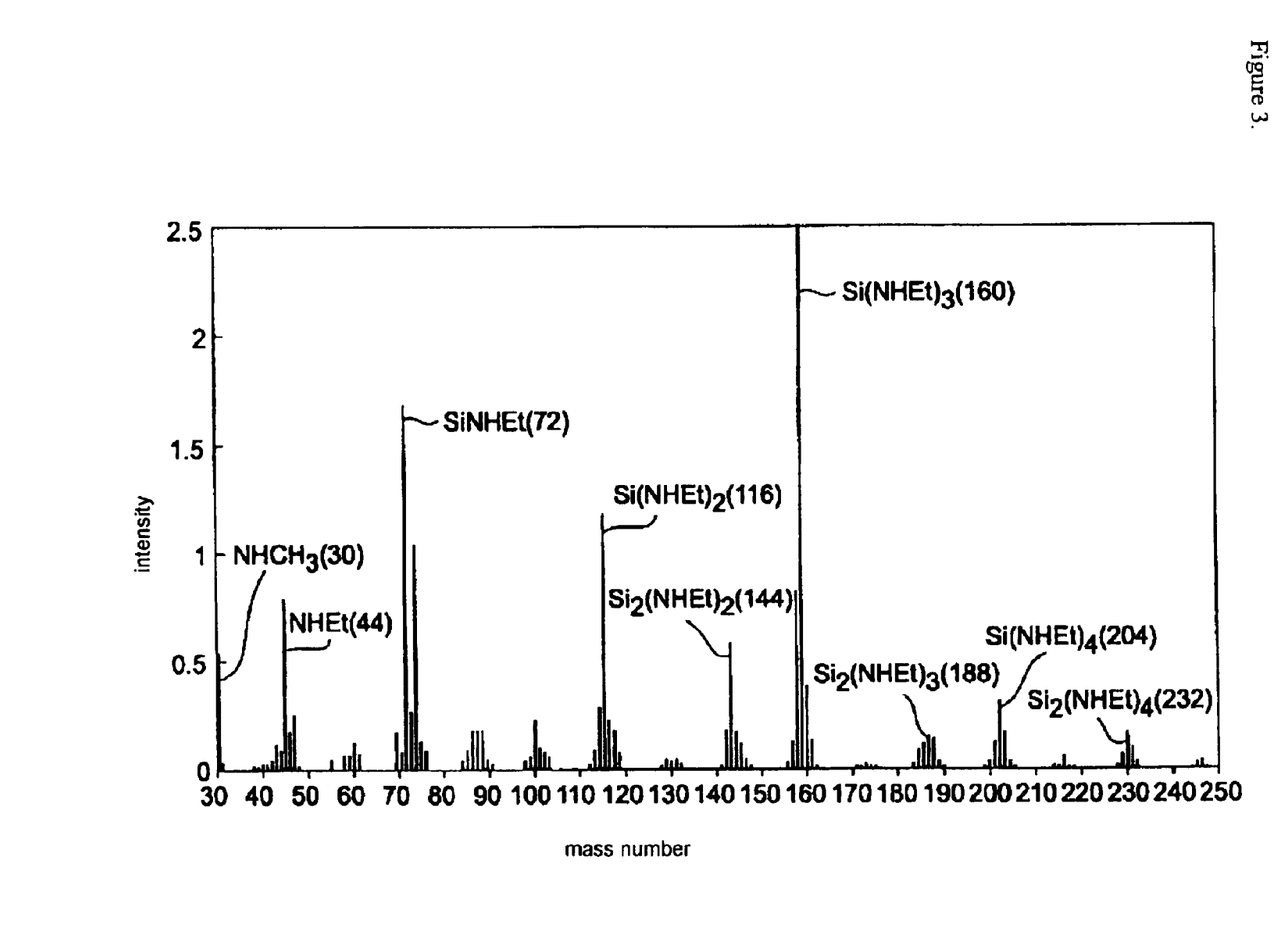
FIG. 3 contains the mass spectrum of the hexakis (monoethylamino) disilane as discussed in Example 1.

FIG. 3 reports the analytical results (spectrum) from QMS (m/e<250) (Et=ethyl in FIG. 3). While the Si—Si bond was present in a number of fragments, for the sake of simplicity assignments are given only for main peaks.

The chlorine content of the synthesized HEAD product, as measured by ion chromatography, was no greater than trace levels. The melting point of the HEAD product was estimated-about 10 C.

Example 1

Deposition of Silicon Nitride Film

A silicon nitride film was deposited in this example on a silicon semiconductor substrate using a CVD reaction apparatus that had the same structure as the CVD reaction apparatus in FIG. 2. The HEAD synthesized in Synthesis Example 1 was used as the HCAD; ammonia was used as the nitrogen-containing gas; and nitrogen was used as the carrier gas. The conditions listed below were used to produce the silicon nitride film. The line L23 was heated to 110° C. during -deposition.

HEAD gas flow rate: 5 sccm
ammonia gas flow rate: 50 sccm
carrier gas (nitrogen) flow rate: 60 sccm
pressure within the reaction chamber: 0.5 Torr
reaction chamber temperature: 550° C.
vaporizer temperature: 110° C.

A silicon nitride film with a thickness of 900 Å was obtained in about 45 minutes as a result (silicon nitride film deposition rate=20 Å/minute). This silicon nitride film had a composition of $Si_{1.5}N_1$ according to analysis by Auger electron spectroscopy.

Using conditions that were otherwise the same as those listed above, silicon nitride films were fabricated using reaction chamber temperatures of 500° C. and 525° C. Silicon nitride films were obtained at deposition rates of 10 Å/minute and 15 Å/minute, respectively.

Example 2

Deposition of Silicon Oxynitride Film

A silicon oxynitride film was deposited in this example on a silicon semiconductor substrate using a CVD reaction apparatus that had the same structure as the CVD reaction apparatus in FIG. 2. The HEAD synthesized in Synthesis Example 1 was used as the HCAD; ammonia was used as the nitrogen-containing gas; oxygen was used as the oxygen-containing gas; and nitrogen was used as the carrier gas. The conditions listed below were used to produce the silicon oxynitride film. The line L23 was heated to 110° C. during production.

HEAD gas flow rate: 2 sccm
ammonia gas flow rate: 50 sccm
oxygen flow rate: 1 sccm
carrier gas (nitrogen) flow rate: 60 sccm
pressure within the reaction chamber: 0.5 Torr
reaction chamber temperature: 550° C.
vaporizer temperature: 110° C.

A silicon oxynitride film with a thickness of approximately 2,000 Å was obtained in about 100 minutes as a result (silicon oxynitride film deposition rate=20 Å/minute). This silicon oxynitride film had a composition of $SiN_{0.42}O_{0.35}$ according to analysis by Auger electron spectroscopy.

As has been described in the preceding, this invention enables the deposition of silicon nitride and silicon oxynitride films by CVD technology at satisfactory film formation rates even at low temperatures and does so without being accompanied by the deposition of large amounts of ammonium chloride.

Example 3

Production of Silicon Nitride Film

A silicon nitride film was deposited in this example on a silicon semiconductor substrate using a CVD reaction apparatus that had the same structure as the CVD reaction apparatus in FIG. 2. The HEAD synthesized in Synthesis Example 1 was used as the HCAD; no nitrogen-containing gas was introduced, and nitrogen was used as the carrier gas. The conditions listed below were used to produce the silicon nitride film. The line L23 was heated to 110° C. during production.

HEAD gas flow rate: 1.5 sccm
carrier gas (nitrogen) flow rate: 15 sccm
pressure within the reaction chamber: 1 Torr
reaction chamber temperature: 450° C.
vaporizer temperature: 110° C.

A silicon nitride film with a thickness of about 1250 Å was obtained in about 150 minutes as a result (silicon nitride film deposition rate=about 8 Å/minute). According to Auger electron spectroscopy the Si to N ratio is about 1.5

REFERENCE SYMBOLS 10, 20 . . . CVD reaction apparatus
11 . . . CVD reaction chamber
12 . . . hydrocarbylaminodisilane (HCAD) supply source
13 . . . nitrogen-containing gas supply source
14 . . . dilution gas supply source
15 . . . oxygen-containing gas supply source
16 . . . carrier gas supply source
17 . . . waste gas treatment apparatus
21 . . . vaporizer
22 . . . sealed container
111 . . . heating means
121 . . . sealed container
122 . . . carrier gas injection conduit L1–L5, L21–L23 . . . line
V1–V4, V21–V22 . . . valve
PG1–PG2 . . . pressure sensor
MFC1–MFC4, MFC21–MFC22 . . . mass flow controller
BV . . . butterfly valve
PM . . . pump It will be understood that many additional changes in the details, materials, steps and arrangement of parts, which have been herein described in order to explain the nature of the invention, may be made by those skilled in the art within the principle and scope of the invention as expressed in the appended claims. Thus, the present invention is not intended to be limited to the specific embodiments in the examples given above.

What is claimed is:

1. A method for producing silicone nitride films comprising:
   a) introducing into a reaction chamber, said chamber containing at least one substrate;
      i) a hydrocarbylaminodisilane compound with general formula (I)

$(R^0)_3$—Si—Si—$(R^0)_3$ (I)

wherein each $R^0$ is independently selected from the group consisting of:
      a hydrogen atom,
      a chlorine atom, and
      a —$NR^1(R^2)$ group,
      wherein at least one $R^0$ is said —$NR^1(R^2)$ group;
      wherein said —$NR^{1(R2)}$) group further comprises $R^1$ and $R^2$
      being each independently selected from the group consisting of:
         a hydrogen atom; and
         a $C_1$ to $C_4$ hydrocarbyl, and
      wherein only one said $R^1$ or $R^2$ is a hydrogen atom, and
      ii) a nitrogen-containing gas; and
   b) reacting said compound and said gas.

2. The method of claim 1, wherein said gas comprises at least one member selected from the group consisting of:
   a) ammonia;
   b) hydrazine;
   c) alklhydrazine compounds; and
   d) hydrogen azide.

3. The method of claim 1, further comprising said hydrocarbylaminodisilane compound of general formula (I)

$(R^0)_3$—Si—Si—$(R^0)_3$ (I)

wherein each $R^0$ is the —$NR^1(R^2)$ group, $R^1$ is a hydrogen atom, and $R^2$ is a $C_1$ to $C_4$ hydrocarbyl.

4. The method of claim 1, wherein said compound contains hexakis(ethylamino)disilane.

5. The method of claim 1, wherein the molar ratio between said compound and said gas is in the range of about 1:0 to about 1:50.

6. The method of claim 1, wherein the pressure within said reaction chamber is in the range of about 0.1 Torr to about 10 Torr.

7. The method of claim 1, wherein the reaction temperature is in the range of about –300C to about 650° C.

8. The method claim of 1, wherein the molar ration between said compound and said gas is in the range of about 1:0 to about 1:50; the pressure within said reaction chamber is in the range of about 0.1 Torr to about 10 Torr; and the reaction temperature is in the range of about –300° C. to about 650° C.

9. The method of claim 1, further comprising:
   a) injecting a carrier gas into the liquid form of said hydrocarbylaminodisilane compound;
   b) entraining said compound as a gas in said carrier gas;
   c) moving said entrained compound through the feed system; and
   d) feeding said entrained compound into said reaction chamber.

10. The method of claim 9, wherein the temperature of said feed system is in the range of about –250° C. to about 25°C.

11. The method of claim 1, further comprising:
    a) vaporizing said compound using a vaporizer;
    b) moving said vaporized compound through the feed system; and
    c) feeding said vaporized compound into said reaction chamber.

12. The method of claim 11, wherein the temperature of said vaporizer is in the range of about 60° C. to about 200° C.

13. The method of claim 10, wherein the temperature of said feed system is in the range of about –250° C. to about 25° C.

14. The method of claim 1, further comprising:
    a) loading said reaction chamber with a quantity of semiconductor substrates; and
    b) mounting said substrates in one chuck or wafer boat.

15. The method of claim 14, wherein said quantity is in the range of about 1 to about 250.

16. A method for producing silicone oxynitride films comprising:
    a) introducing into a reaction chamber, said chamber containing at least one substrate;
       i) a hydrocarbylaminodisilane compound with general formula (I)

$(R^0)_3$—Si—Si—$(R^0)_3$ (I)

wherein each $R^0$ is independently selected from the group consisting of:
       a hydrogen atom,
       a chlorine atom, and
       a —$NR^1(R^2)$ group,
       wherein at least one $R^0$ is the —$NR^1(R^2)$;
       wherein said —$NR^1(R^2)$ group further comprises $R^1$ and $R^2$;
       wherein said $R^1$ and $R^2$ are each independently selected
       from the group consisting of:
          a hydrogen atom, and
          a $C_1$ to $C_4$ hydrocarbyl; and
       wherein only $R^1$ or $R^2$ is said hydrogen atom; and
       ii) a nitrogen-containing gas,
       iii) an oxygen-containing gas, and
    b) reacting said compound, said nitrogen-containing gas, and said oxygen-containing gas.

17. The method of claim 16, wherein said nitrogen-containing gas comprises at least one member selected from the group consisting of:
    a) ammonia;
    b) hydrazine;
    c) alklhydrazine compounds; and
    d) hydrogen azide.

18. The method of claim 16, wherein said oxygen-containing gas comprises at least one member selected from the group consisting of:
a) nitric oxide;
b) nitrous oxide;
c) nitrogen peroxide;
d) oxygen;
e) ozone;
f) water vapor; and
g) hydrogen peroxide.

19. The method of claim 16, further comprising said compound of general formula (I)

(I)

wherein each $R^0$ is the $-NR^{1(R2)}$ group, $R^1$ is a hydrogen atom, and $R^2$ is a $C_1$ to $C_4$ hydrocarbyl.

20. The method of claim 16, wherein said compound comprises hexakis(ethylamino)disilane.

21. The method of claim 16, wherein the molar ratio between said compound and said nitrogen-containing gas is in the range of about 1:0 to about 1:50.

22. The method of claim 16, wherein the molar ratio between said compound and said oxygen-containing gas is in the range of about 50:1 to about 1:10.

23. The method of claim 16, wherein the pressure within said reaction chamber is in the range of about 0.1 Torr to about 10 Torr.

24. The method of claim 16, wherein the reaction temperature is in the range of about −300C to about 750° C.

25. The method of claim 16, wherein the molar ratio between said compound and said nitrogen-containing gas is in the range of about 1:0 to about 1:50, the molar ratio between said compound and said oxygen-containing gas is in the range of about 50:1 to about 1:10, the pressure within said reaction chamber is in the range of about 0.1 Torr to about 10 Torr, and the reaction temperature is in the range of about −300° C. to about 750° C.

26. The method of claim 16, further comprising:
a) injecting a carrier gas into the liquid form of said compound;
b) entraining said compound as a gas in said carrier gas;
c) moving said entrained compound through the feed system; and
d) feeding said entrained compound into said reaction chamber.

27. The method of claim 26, wherein the temperature of said feed system is in the range of about 25° C. to about −250° C.

28. The method of claim 16, further comprising:
a) vaporizing said compound using a vaporizer;
b) moving said vaporized compound through said feed system; and
c) feeding said vaporized compound into said reaction chamber.

29. The method of claim 28, wherein the temperature of said feed system is in the range of about 25° C. to about −250° C.

30. The method of claim 16, wherein the temperature of said vaporizer is in the range of about 60° C. to about 200° C.

31. The method of claim 16, further comprising:
a) loading said reaction chamber with a quantity of semiconductor substrates; and
b) mounting said substrates in one chuck or wafer boat.

32. The method of claim 31, wherein said quantity is in the range of about 1 to about 250.

* * * * *

UNITED STATES PATENT AND TRADEMARK OFFICE
CERTIFICATE OF CORRECTION

PATENT NO. : 6,936,548 B2
DATED : August 30, 2005
INVENTOR(S) : Christian Dussarrat and Jean-Marc Girard It is certified that error appears in the above-identified patent and that said Letters Patent is hereby corrected as shown below:

Column 9,
Line 32, replace the term "-$NR^{1(R2)}$)" with the term -- -$NR^1(R^2)$ --.
Line 46, replace the word "alklhydrazine" with the word -- alkylhydrazine --.
Line 64, replace the term "-300C" with the term -- -300°C. --.
Line 65, replace the word "ration" with the word -- ratio --.

Column 10,
Line 25, replace the number "10" with the number -- 11 --.
Line 51, replace the words "$R^2$are" with the words -- $R^2$ are --.
Line 66, replace the word "alklhydrazine" with the word -- alkylhydrazine --.

Column 11,
Line 17, replace the term "-$NR^{1(R2)}$)" with the term -- -$NR^1(R^2)$ --.
Line 18, replace the words "$R^{2\ is\ a\ C}{}_1$" with the words -- $R^2$ is a $C_1$ --.
Line 32, replace the term "-300C" with the term -- -300° C. --.

Signed and Sealed this

First Day of November, 2005

JON W. DUDAS
*Director of the United States Patent and Trademark Office*